United States Patent [19]

Newman

[11] 4,326,173

[45] Apr. 20, 1982

[54] DIGITAL PHASE LOCKED LOOP FREQUENCY CONTROL SYSTEM

[75] Inventor: Raymond A. Newman, Cheektowaga, N.Y.

[73] Assignee: NP Industries, Inc., Tonawanda, N.Y.

[21] Appl. No.: 198,487

[22] Filed: Oct. 20, 1980

Related U.S. Application Data

[62] Division of Ser. No. 20,218, Mar. 14, 1979, Pat. No. 4,254,482, which is a division of Ser. No. 818,656, Jul. 25, 1977, Pat. No. 4,145,914.

[51] Int. Cl.³ .......................................... H03L 7/08
[52] U.S. Cl. ......................................... 331/1 A; 331/25
[58] Field of Search .......................... 331/1 A, 18, 25; 328/155; 343/5 AF, 7 PL; 367/95, 97

[56] References Cited

U.S. PATENT DOCUMENTS 3,921,095  11/1975  Chu ..................................... 331/1 A
4,123,724  10/1978  Das et al. ............................. 331/1 A

Primary Examiner—Siegfried H. Grimm
Attorney, Agent, or Firm—Joseph P. Gastel; Martin LuKacher

[57] ABSTRACT

A system for the automatic measurement of the level, flow rate, and flow volume of liquid flowing through a channel is described. An echolocation system operates to detect returns from the surface of the liquid in the channel during successive transmission cycles in response to the reflection of sonic signals. A source of pulses having a frequency which provides a certain number of pulses corresponding to the travel time of the sonic signals over a distance equal to a maximum predetermined level or head of the liquid in the channel provides pulses from which the liquid level, flow rate, and flow volume can be obtained. The control of the frequency of the pulses from which the measurements are obtained may be accomplished by a digital phase locked loop system to minimize the effects of changes in ambient condition, such as temperature, vapor pressure, and composition of atmosphere as often occurs in such conduits. The system may therefore be used for monitoring liquid levels in a container, effluents, such as waste water in a sewage system and controlling the sampling of such waste water each time a preset volume thereof is discharged via the conduit. Also solids levels in a container may be measured as may any distance from the transducer according to its preset range.

3 Claims, 3 Drawing Figures

DIGITAL PHASE LOCKED LOOP FREQUENCY CONTROL SYSTEM

This is a division, of application Ser. No. 20,218 filed on Mar. 14, 1979, now U.S. Pat. No. 4,254,482, which is a division of application Ser. No. 818,656, filed on July 25, 1977, now U.S. Pat. No. 4,145,914, issued Mar. 27, 1979.

The present invention relates to a digital phased locked loop system particularly useful in echolocation systems which provide for measuring of the level of fluids and other materials and of the flow rate and flow volume of fluid and flowable material along a channel.

The invention is especially suitable for use in a waste water sampling system for monitoring the level, flow rate and flow volume of effluent, such as waste water, which passes through a conduit and for controlling the system to take precise and representative samples of the effluent each time a certain volume passes through the conduit. The invention is also suitable for measuring, indicating and displaying the level of material which may be contained in a region such as a silo, bin, and other vessel or container. A waste water sampling system in which the invention may be used for the measurement of liquid level and volume is described in U.S. Pat. No. 4,024,766 issued May 24, 1977 to Jack A. Perry, Ser. No. 650,377, filed Jan. 19, 1976. Features of the invention provide for high resolution measurement of distance in accordance with the propagation time of sonic signals, and for operation in environments which may produce false or missing returns from such signals. The invention has application in many echolocation systems.

Aside from difficulties in the reliable detection of sonic signals and errors due to the effect of ambient conditions on sonic signals, the problem remains of having to measure the level of material in a region, such as the level of liquid in a channel and the flow rate and volume or totalized flow so as to operate a sampler or other flow proportional controlled device without considerable data processing as may require the use of large amounts of computer time. It is usually necessary that the measurement, such as of liquid level and also of flow rate and volume, be made in real time and continuously to facilitate sampling and other process control operations.

For further information respecting schemes which have been suggested for the detection and compensation of sonic signals in spite of noise, random reflections and false returns, reference may be had to U.S. Pat. Nos. 3,757,285, issued Sept. 4, 1973; 3,064,234 issued Nov. 13, 1962; 3,439,318 issued Apr. 15, 1969; 3,824,464 issued July 16, 1974; and 4,016,529 issued Apr. 5, 1977.

Accordingly, it is an object of the present invention to provide improved echolocation systems whereby distances may be measured through the use of sonic signals with high accuracy in the presence of false returns and in environments subject to changes in temperature, atmosphere composition and other ambient conditions.

It is a further object of the present invention to provide an improved system for digitally phase locking in order to maintain an output signal frequency in the absence of the second of two input signals, such as a missing return in an echolocation system.

It is a still further object of the present invention to provide improved sonic echolocation systems for distance measurement as well as for the measurement of fluid level and fluid flow, either flow rate or volume, in which the foregoing problems and difficulties are substantially eliminated.

The foregoing and other features, objects and advantages of the invention as well as a presently preferred embodiment thereof will become more apparent from a reading of the following description in connection with the accompanying drawings in which.

Figure 1:
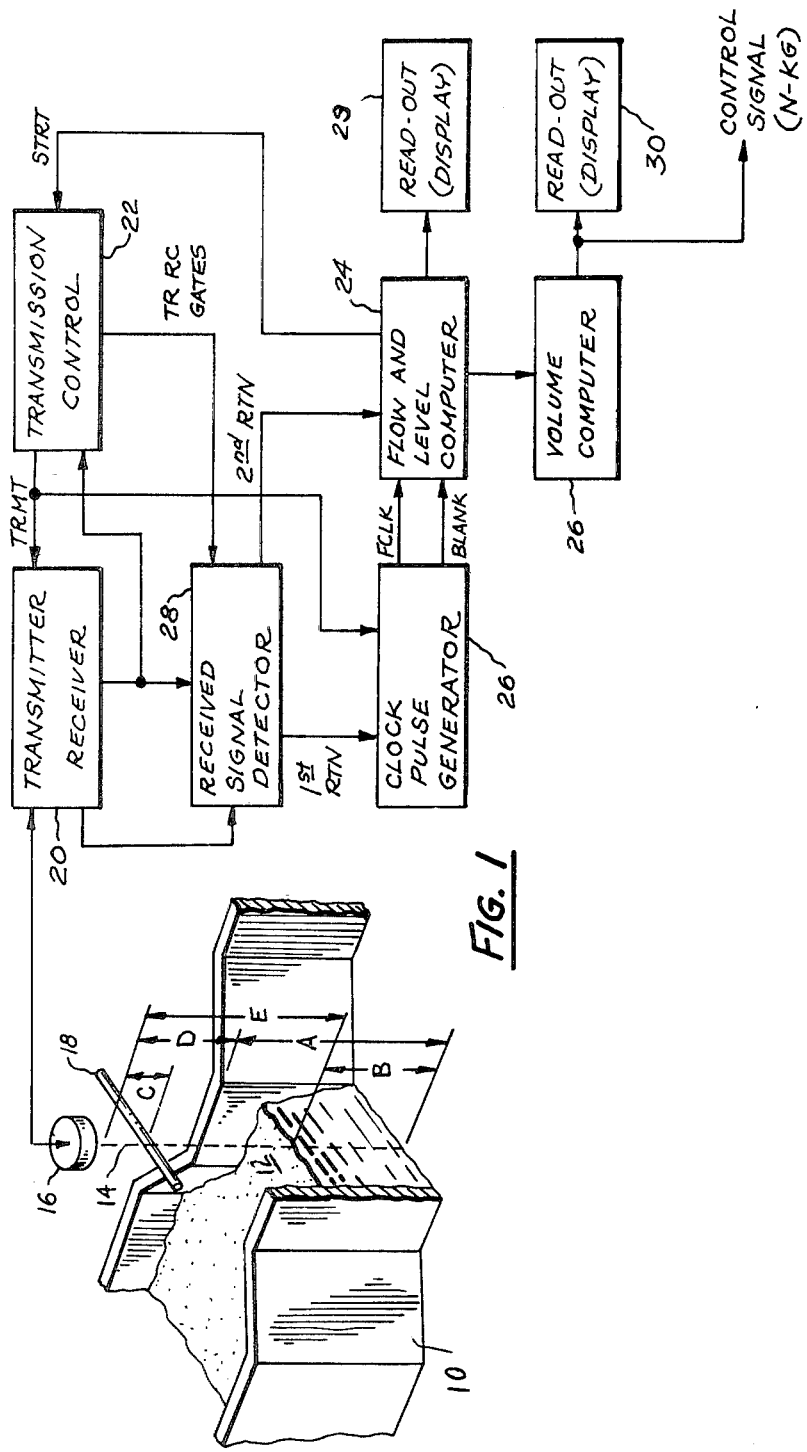
FIG. 1 is a block diagram schematically showing a level flow rate, and volume measurement system embodying the invention.
Figure 2:
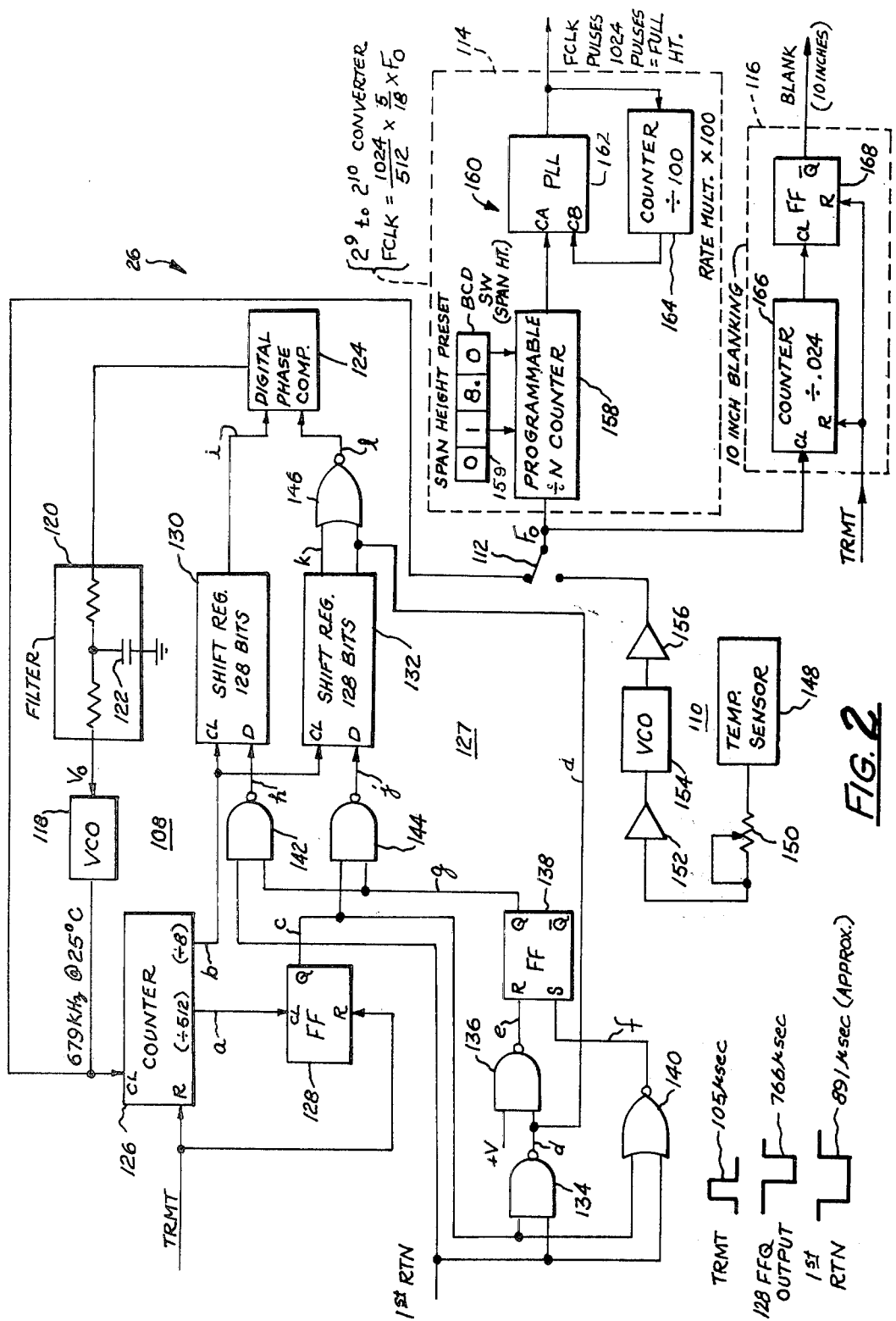
FIG. 2 is a block diagram illustrating the clock pulse generator of the system shown in FIG. 1.
Figure 3:
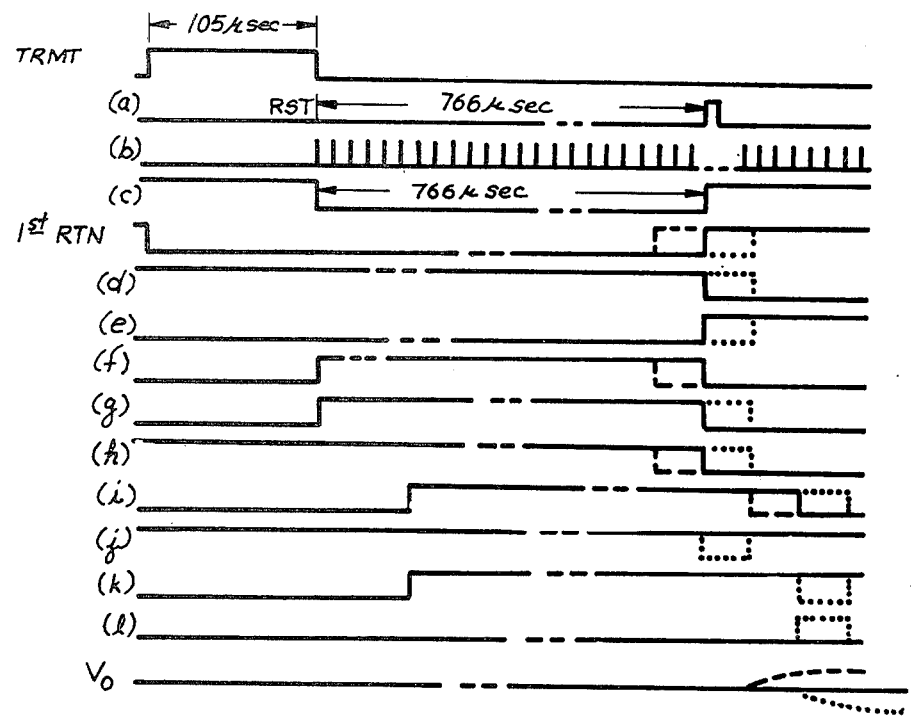
FIG. 3 is a timing diagram illustrating signals generated in the operation of a portion of the clock pulse generator shown in FIG. 8.

Referring first to FIG. 1, there is shown a flume 10 having a region 12 through which material flows. The material in this illustrative example is a liquid such as the waste water effluent which is to be monitored. Other channels in the form of pipes or weirs or other conduits may be used. The system may also be used to provide continuous measurements of material level in silos, bins and other vessels or containers. In the application which is illustrated, the system is operative to measure, indicate and if desired record, liquid level, the flow rate of the liquid, and the volume of the flow. This system is also capable of totalizing the flow and providing outputs for operating a sampler, chlorinator or other device or process in which control in proportion to flow is to be obtained.

Sound waves are transmitted and received along a path indicated by the dash line 14 by a transducer 16. A reference reflector 18 is disposed between the transducer 16 and the top of the flume 10 at a fixed distance from the transducer 16. The reflector 18 and the transducer 16 may be assembled as a unitary structure. The reflector 18 is located along the path 14 so as to partially reflect the sound waves which are incident thereon and pass the remaining waves into the region 12. A suitable reflector may be a rod of about 1/16th or ⅛ th inch diameter, or it may be a flat plate ¼ inch wide. The height from the bottom through the top of the flume is referred to as the span height and is shown in the drawing as being the distance A. The liquid level which is sometimes referred to as the head, in the region 12 (viz, across a cross-section of the region perpendicular to the direction of flow through the flume) varies in accordance with the amount of liquid therein. This head is indicated as being the distance B. The distance separating the transmitting surface or radiator of the tranducer 16 and the reference reflector 18 is shown as the distance C. The distance between the radiator of the transducer 16 and the height of the span is the separation between the transducer and the top of the flume. This distance is indicated as D.

Sonic signals or sound waves which are transmitted by the transducer are received after reflection, first from the reference reflector 18 and then from the surface of the liquid. Reception of these signals after reflection are recognized by the system as first and second returns (1st RTN and 2nd RTN). The system has means for discriminating against false returns such that the first and second returns due to reflection from the reference reflector 18 and from the surface of the liquid, will be detected.

The sonic signals which are transmitted are desirably at ultrasonic frequency. Higher frequencies are used where the length of the path 14 over which the sonic signals travel between transmission and reception at the transducer 16 are relatively short. For distances of approximately three feet as measured between the transducer 16 and the bottom of the flume 10 along the path 14 a frequency of approximately 100 KHz is suitable. The use of this frequency enables high resolution measurements and also facilitates the location of the transducer 16 in close proximity to the region where measurements are to be made. The system described herein utilizes 90 KHz sonic signals, and a spacing D between the head and the top of the span of the flume 10 of ten inches. It will therefore be apparent that the invention may be used in confined areas such as within sewer pipes and other conduits carrying liquids for processing where limited space is available. The system may also be utilized where more space is available or where the removal of the transducer 16 well away from the region 12 is desired. In such applications lower sonic signal frequences may be used. For example, where the transmission path is up to ten feet long, the sonic signals may be at 43 KHz. For a path length of 36 feet, 36 KHz may be suitable, and for path lengths up to 120 feet, 20 KHz may be suitable. These are approximate frequences and depend to some extent upon the design of the transducer 16.

The system operates continuously with continuous transmissions which repeat cyclicly several hundred times per second. The period between transmissions is dependent upon the span height. It is a feature of the system to provide a digital output corresponding to a certain digital number, in the illustrated case $2^{10}$ or 1024., for a liquid level which fills the span to a predetermined height which is in the illustrated application equal to the span height of the flume (distance A). The transmissions are repetitive each time a sequence of standard pulses which are referred to herein as FCLK are generated. Accordingly, the transmission cycles are repetitive at a rate which is dependent upon the span height. For a 30 inch span the rate may typically be 200 transmission cycles per second. During each of these cycles a successive measurement is made. These measurements therefore appear and are available continuously and in real time.

A transmitter receiver unit 20 transmits bursts of pulses to the transducer 16. These pulses are translated in the transmitter and transducer into generally sinusoidal sonic signals. The transmission is in bursts containing a predetermined number of such signals; nine or ten signals being suitable. The signals received by the transducer 16 are translated into electrical signals and applied to the transmitter receiver 20.

Timing of the transmission and reception period is provided by a transmission control unit 22. The start of each transmission is signalled by a start pulse (STRT) from a flow and level computer unit 24 which responds to a sequence of FCLK pulses from a clock pulse generator 26. When these pulses total the number corresponding to the span height, the start pulse is generated to initiate the transmission cycle.

The transmission control unit 22 generates a transmit pulse (TRMT) at the start of each transmission cycle. The TRMT pulse commands the transmitter receiver 20 to transmit a burst of pulses to drive the transducer 16. These pulses are translated into sonic signals. When these signals are reflected from the reference reflector 18 and from the surface of the liquid in the region 12, and are received by the transducer 16, they are used to provide outputs to a received signal detector unit 28 and to the transmission control unit 22. The transmission control unit outputs gate signals, forming time slots of predetermined length, during transmission and reception times or periods commensurate with the time during which the bursts are transmitted. These gate signals are referred to as TRRC gates. The transmitted signals may also be applied from the transmitter receiver unit 20 to the received signal detector 28 upon transmission.

The received signal detector 28 has the means for discriminating against false returns, which are operated by the TRRC gates and the received signals. The transmitted signals may also be used. Specifically, the received signal detector functions to output the 1st RTN and 2nd RTN signals successively and only when the received signals are equal in number to the transmitted signals and arrive during the receive gates. It is the last of the return signals which, when received during the receive gates, initiate the 1st and 2nd returns.

The time between the end of the TRMT signal and the first return will be the travel time for the sonic signals between the radiator of the transducer 16 and the reference reflector 18; in other words twice the distance C. The TRMT signal and the first return may be used in the clock pulse generator to establish a standard frequency for the travel time (i.e., to calibrate the clock pulse generator). The standard frequency is a function of travel time, irrespective of environment conditions such as changes in ambient temperature and/or composition of atmosphere which may affect the velocity of sound. Alternatively, a temperature sensor may be used to calibrate an oscillator which provides the standard frequency, in which case the reference reflector 18 need not be used. The use of a reference reflector and the TRMT and first returns to provide the standard frequency irresponsive of ambient and other environmental conditions is preferred.

The clock pulse generator 26 utilizes the standard frequency to develop a blanking signal (BLANK) having a period corresponding to the travel time of the sonic signals over the distance between the radiating surface of the transducer 16 and the top of the span of the flume 10 (i.e., distance D). The generator 26 also is operative to translate the standard frequency into the FCLK frequency as may be accomplished by ratioing the distances which provide the standard frequency with the distance equal to the span height. A factor is also included to translate the clock frequency such that a multi-digit binary number, suitably $2^{10}$, corresponds to the travel time of the sonic signals between the top and the bottom of the flume (viz, twice the span height, or two times the distance A).

The flow and level computer 24 utilizes the BLANK signal and the FCLK signal directly to provide the liquid level. The computer 24 also contains means for translating the liquid level into flow rate as a function of the flow characteristics of the primary flow element employed, e.g., the flume 10. Level and flow rate may be read out on a display 29 such as an LED display and/or recorded on a chart recorder. A digital to analog converter which translates the ten-bit digital number into an analog signal may be used to operate the chart recorder.

A volume computer 26 utilizes the flow output which may be in the form of a digital signal and totalizes the flow to provide output units of volume, such as kilogallons to a readout or display 30. The volume computer also outputs a train of pulses where each pulse represents a kilogallon. These pulses may be counted in a counter which operates to provide an output when N kilogallons is totalized. A water sampler or other flow proportional process control device may be operated by this output.

The clock pulse generator 26 may be implemented by the circuitry shown in FIG. 8. A phase locked loop 108 or a temperature control variable frequency pulse generator 110 may alternatively be selected by means of a switch 112 to provide a standard pulse frequency $f_o$. This pulse frequency is applied to a translator 114 which translates the standard frequency into the FCLK pulses. The certain number $2^{10}$ or 1024 of FCLK pulses corresponds to the full span height. A blanking signal generator 116 also is operated by the standard pulses so as to produce an output to account for the travel time of the sonic signals over a distance D (FIG. 1) between the top of the span of the flume 10 and the radiator of the transducer 16. In this illustrative embodiment the distance D is taken to be ten inches.

In order to facilitate the use of binary devices, the standard frequency is selected such that $2^9$ or 512 pulses are produced during the time for transmission of the sonic signals from the transducer 16 to the reference reflector 18 which is located five inches therefrom and back to the transducer 16. This frequency at standard temperature and pressure in air will be approximately 679 KHz. The phase locked loop 108 is locked so as to produce 512 pulses between the time of transmission and the time of the first return. In the illustrated system, which utilizes a burst of nine pulses and generates the return upon reception of the last of these pulses, the end of the TRMT control signal and the end of the first return are utilized to lock the loop 108. At standard temperature and pressure in air this time period is, as shown in FIG. 5, approximately 766 us.

The phase locked loop 108 provides the standard frequency $f_o$ from the output of a voltage controlled oscillator 118. The frequency of this oscillator is stabilized in the phase locked loop 108 in which it is contained. The loop is provided by an output filter 120 having a storage capacitor 122 across which a D.C. error voltage $V_0$ is developed and applied to the control input of the VCO 118. Signals for charging and discharging the capacitor or for maintaining the charge which has been stored thereon are obtained from the output of a digital phase comparator 124. Control signals for the digital phase comparator 124 are obtained by means of a counter 126 which divides the output of the VCO by 512. The counter is reset by the end of the TRMT control level, such that the counter output is produced at the time after the transmission when the first return should occur. This is approximately 891 us after the beginning of the TRMT level and 766 us approximately after the end of the TRMT level.

The first return is applied to the loop, and if it occurs in synchronism with the output from the counter, the frequency of the VCO is maintained. If the first return is early, the VCO frequency is reduced, by reducing the error voltage $V_0$. Conversely, if the return is late the error voltage is increased so as to increase the VCO frequency.

The possibility exists, however, that the return may not occur. In this instance it is desirable that the frequency not be varied but maintained at its previous value. Transmission cycles repeat at a high rate, which may for example be 200 per second. On average there will be sufficient first returns to maintain the loop in locked condition.

Digital logic 127 is provided between the output of the counter 126 and the inputs to the digital phase comparator 124 for providing data signals to the digital phase comparator inputs for operating the phase comparator such that the direct current error voltage $V_0$ varies to compensate for differences in phase between the actual time of arrival of the first return and its anticipated time of arrival while at the same time preventing any significant changes in frequency in the absence of a first return. This digital logic 127 may be considered to include the counter 126 or may be taken to be the logic operable in response to the output of the counter, the TRMT control level and the 1st RTN for providing data inputs to the digital phase comparator 124 which results in the requisite changes in the error voltage $V_0$.

The digital phase comparator 124 is desirably an integrated circuit device the output of which may be tri-stated, the three states being a high impedance OFF state and a high and low voltage ON state. Thus, when the output of the comparator is in the high voltage state the capacitor 122 of the filter charges and the error voltage $V_0$ increase. In the low voltage ON state the capacitor 122 can discharge. In the high impedance OFF state, the charge and the error voltage $V_0$ remains in its previous condition. A suitable integrated circuit digital phase detector is the type MC 4007 produced by Motorola Semiconductor Products.

The operation of the digital logic 127 to provide the requisite data inputs to the phase comparator 124 may be observed with reference to FIG. 9. The end of the TRMT level establishes the reset time when the counter 126 and a flip-flop 128 are reset. The counter 126 outputs a pulse when 512 pulses from the VCO 118 occur. The counter 126 also provides a divide-by-eight output which produces clock pulses used in the digital logic 127. These clock pulses occur at a much greater rate than the output pulses from the counter. There will be sixty-four clock pulses for each primary output pulse to the flip-flop 128. Upon occurence of a clock pulse, the then reset flip-flop 128 is set. Reset occurs at the time the first return is expected. The TRMT level, the counter output and the first return are utilized in the digital logic 127 to generate data inputs to the digital phase comparator. These data inputs are shifted in time (i.e., delayed), in order to allow time for the digital logic 127 to operate, by means of shift registers 130 and 132. These registers are clocked by the clock pulses from the divide-by-eight output of the counter 126. A separate counter could of course be used. However, the use of the counter 106 simplifies the construction.

Consider the situation when the first return is synchronous with the counter output. This case is illustrated by the solid line waveform in FIG. 9. Until the first return arrives, the Q output of the flip-flop 128 is low (not asserted). The output of a NAND gate 134 remains high. Another NAND gate 136 inverts this output and applies a low level to a reset input of a flip-flop latch 138. This latch 138 may be implemented out of cross-connected NOR gates. The Q output of the flip-flop 128 in the absence of the first return provides a high output from a NOR gate 140. Thus between reset and the arrival of the return, the flip-flop 138 is set and its Q output is high. The data inputs of the shift registers 130 and 132 then receive, through NAND gates 142 and 144, a high level and a low level respectively. These levels are shifted through the registers 130 and 132. The output of the shift register 130 remains high between reset and the first return. High level tri-states the digital phase comparator 124 on condition that a low level is applied to the other data input thereof. The output of the shift register 132 is low. However, in the absence of a first return, the NAND gate 134 enables a NOR gate 146 thus maintaining the other input to the phase comparator low. The phase comparator is tri-stated and no change occurs until the arrival of the first return.

The in-phase arrival of the first return changes the state of the flip-flop latch 138. The data input to the shift register 130 then changes state and the upper data input to the digital phase comparator 124 becomes low. No change occurs in the data input to the other shift register 132 and the low input to the digital phase comparator 124 remains low. The digital phase comparator then charges the capacitor 122 in the filter. Discharge occurs on the next TRMT which resets both the counter 126 and the flip-flop 128. An average value $V_0$ at the output of the filter is then developed which is at the level for providing 679 KHz as the output frequency at standard temperature and pressure in air.

If the first return occurs early, as shown in FIG. 9 by the dash line, charging of the capacitor 122 in the filter 120 occurs earlier in time and the error voltage increases, thus increasing the frequency of the VCO to track the first return. Conversely when the first return is late, as shown by the dotted lines in FIG. 9, the digital phase comparator remains tri-stated until the occurrence of that return. Then the lower data input to the phase comparator 124 goes high causing the phase comparator to permit the capacitor to discharge and reducing the filter output voltage. In the absence of a return, the tri-stated condition of the digital phase comparator continues for the remainder of that transmission cycle. When the error voltage $V_0$ is reduced so is the output frequency of the VCO as it continues to track the first return.

In some applications, as for example when there is no room even for the reference reflector 18 (FIG. 1), it may be desirable to use the temperature controlled source 110. In this source, a temperature sensor 148, such as a thermoelectric device or temperature dependent resistor through which a current is passed, provides a variable output which is scaled by a potentiometer 150, amplified in an amplifier 152 and applied as an error voltage to control the frequency of a VCO 154. The output of the VCO is limited as in a shaper amplifier 156 and used as the standard frequency $f_o$.

The standard frequency produces 512 pulses and this number of pulses corresponds to the distance (C, FIG. 1) between the reflector 18 and the transducer 16. These 512 pulses ($2^9$ pulses) are scaled to provide 1024 or $2^{10}$ pulses for the time required for the sonic signals to travel the span height of the flume 10. The conversion produces the $F_{CLK}$ pulses in accordance with the relationship $F_{CLK} = 1024/512 \times 5/N \times F_o$. N is the span height in inches. This scaling or ratioing is accomplished by the transistor 114 which uses a presetable or programable divide by N BCD counter 158 which is preset to the span height by means of BCD switches 159. The dividing ratio is set in the counter such that the counter divides by the span height factor times 100. The 100 factor is compensated by means of a rate multiplier 160 consisting of a phase locked loop 162 and a divide by 100 counter 164, which multiplies the frequency of the programmable counter output by 100. The phase locked loop may be an integrated circuit phase locked loop of the type which is available from semiconductor manufacturers. The translator 114 thus implements the scaling or ratioing and provides $2^{10}$ or 1024 pulses as its FCLK output for a distance of travel of the sonic signals equal to the span height of the flume 10.

The standard frequency signal $f_o$ is utilized to provide the blanking output BLANK corresponding to the travel time of the sonic signals over the ten inch distance between the transducer and the top of the flume 10. This blanking signal is developed by a divide by 1024 counter 166 which is reset by the TRMT level. Since the counter 166 counts the standard frequency pulses $f_o$, a count of 1024 of these pulses corresponds to the transmission of the sonic signals over a distance of ten inches. The ten inch BLANK signal is obtained from a flip-flop 168 which is reset by the TRMT level and clocked by the output pulses from the counter 166. The $\overline{Q}$ output of the flip-flop 168 is used, which remains high between the reset and the occurrence of the output pulse from the counter 166.

While the system has been described in order to illustrate its presently preferred embodiment, variations and modifications in the hereindescribed system, within the scope of the invention, will undoubtedly suggest themselves to those skilled in the art. Accordingly, the foregoing description should be taken merely as illustrative and not in any limiting sense.

What is claimed is:

1. A digital phase locked loop system for maintaining an output signal frequency in the absence of the second of two input control signals which comprises
   a variable frequency oscillator for providing said output signal and having an error signal input for controlling the output signal frequency,
   digital phase comparator means having a pair of inputs and an output providing said error signal input in accordance with the D.C. valve thereof,
   a counter for counting the cycles of said oscillator output signal, said counter having a dividing ratio such that the period of the output pulses from said counter equals the period between said two input control signals when said loop is locked,
   means for resetting said counter upon occurrence of the first of said two input control signals, and
   digital logic means responsive to said first input control signal and said counter output pulses for providing a pair of data signals the first of which changes state periodically at a given rate and the second of which remains in the same state, said digital logic means also being responsive to the second of said input control signals for changing the state of at least one of said data signals when said second input control signal occurs, the one of said data signals which changes state depending upon the phase relationship of said input control signals, and changing the state of neither of said data signals if said second input control signal is absent, and means for applying said data signals separately to the pair of inputs of said phase comparator.

2. The invention as set forth in claim 1 wherein said phase comparator has a filter including a charging capacitor circuit in its output, and means for placing the output in three states, namely, a high voltage state, a low voltage state and a high impedance state, said phase detector capacitor circuit output being in said high impedance state when the state of said phase comparator data inputs is unchanged and in one of said high and low voltage states when one of said data inputs thereof changes and in the other of said high and low voltage states when the other of said phases detector inputs changes.

3. The invention as set forth in claim 2 wherein said means for applying said data signals to the pair of data inputs of said comparator comprises a pair of shift registers having data and clock inputs and data outputs, said shift register data outputs being separately connected to said phase comparator data inputs and said shift register data inputs having said first and second data signals separately applied thereto, and means for applying signals derived from said oscillator output signals to said clock input at a rate faster than the repetition rate of said counter output pulses.

* * * * *